(12) United States Patent
Garssen et al.

(10) Patent No.: US 7,015,492 B2
(45) Date of Patent: Mar. 21, 2006

(54) METHOD AND APPARATUS FOR MAPPING OF WAFERS LOCATED INSIDE A CLOSED WAFER CASSETTE

(75) Inventors: Adriaan Garssen, Utrecht (NL); Joost van Groen, Utrecht (NL); Christianus Gerardus Maria de Ridder, Hoogland (NL)

(73) Assignee: ASM International N.V., Bilthoven (NL)

( * ) Notice: Subject to any disclaimer, the term of this patent is extended or adjusted under 35 U.S.C. 154(b) by 236 days.

(21) Appl. No.: 10/641,806

(22) Filed: Aug. 15, 2003

(65) Prior Publication Data

US 2005/0035313 A1    Feb. 17, 2005

(51) Int. Cl.
*G01N 21/86* (2006.01)
(52) U.S. Cl. .................... 250/559.4; 220/221
(58) Field of Classification Search .............. None
See application file for complete search history.

(56) References Cited

U.S. PATENT DOCUMENTS

| 5,721,607 A | 2/1998 | Ota ............................. 355/53 |
| 5,995,234 A | 11/1999 | Nishi .......................... 356/401 |
| 6,013,920 A | 1/2000 | Gordon et al. ......... 250/559.36 |
| 6,452,503 B1 * | 9/2002 | Weiss .......................... 340/673 |

* cited by examiner

*Primary Examiner*—David Porta
*Assistant Examiner*—Pascal M. Bui-Pho
(74) *Attorney, Agent, or Firm*—Knobbe, Martens, Olson & Bear, LLP

(57) ABSTRACT

Wafers in a cassette are mapped without having to open the cassette. The cassette is at least partially transparent to a particular type of radiation. A source of the radiation is directed into the cassette, through a transparent or translucent part of the cassette, and an imaging sensor sensitive to the radiation detects radiation that is reflected off the wafers inside the cassette. A second source of radiation and a second camera preferably provide additional images of the wafers from a different angle. By processing these images, the spatial orientation of the wafers and loading status of the cassette can be determined.

42 Claims, 11 Drawing Sheets

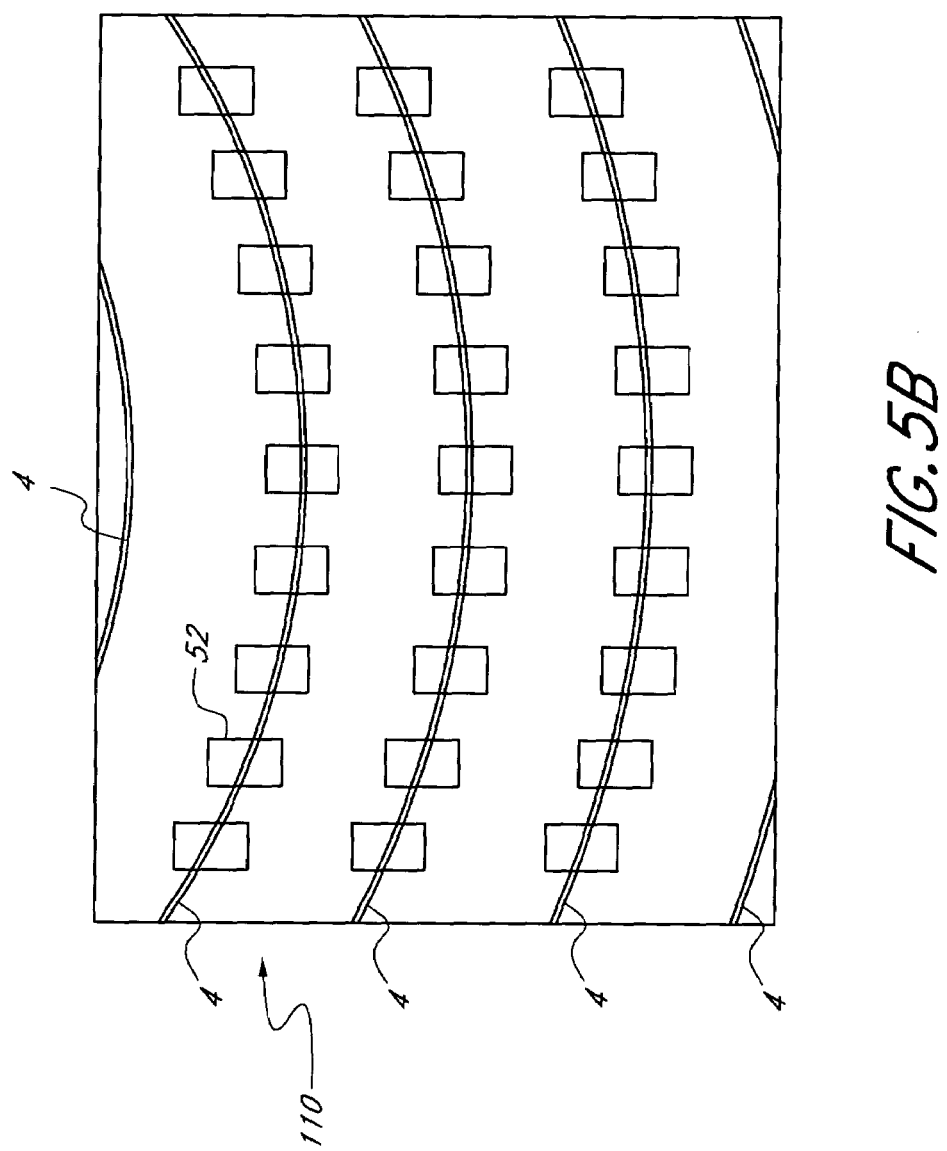

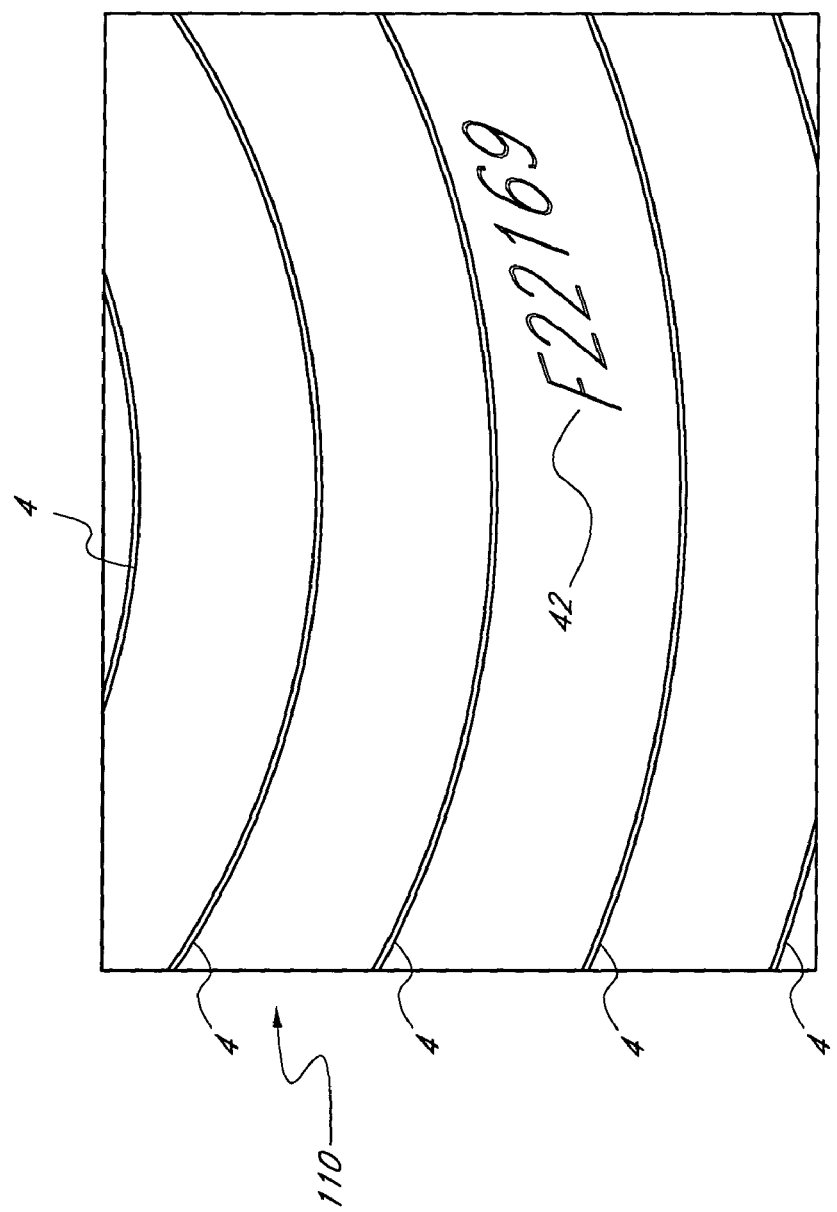

METHOD AND APPARATUS FOR MAPPING OF WAFERS LOCATED INSIDE A CLOSED WAFER CASSETTE

BACKGROUND OF THE INVENTION

1. Field of the Invention

The invention generally relates to a method and apparatus for determining the wafer loading status of a cassette. More particularly, the present invention relates to a method and an apparatus for determining the loading status of a cassette of a type that completely encloses the wafers, such as a Front Opening Unified Pod (FOUP).

2. Description of the Related Art

In general, wafer-mapping systems are used to determine the loading status or arrangement of wafers stored in a cassette, i.e., a wafer holder that can hold a plurality of wafers for wafer transport. The wafers are typically coaxially aligned and stacked in a spaced arrangement within the cassette. By analyzing the spatial position and/or orientation of the wafers in the cassette it is possible to detect erroneous conditions, such as a missing wafer, a broken wafer, or a cross-slotted wafer present in the cassette. Consequently, where improper loading of wafers in a cassette is detected, the processing of the wafers in such a cassette can be prevented and a possibly disastrous condition can be circumvented.

Wafer cassettes can include Front Opening Unified Pod (FOUP) systems. With FOUPs, it is known to provide a wafer mapping system on the load port interface to index along the vertical axis in order to provide presence and positional information about the wafers within a particular pod or cassette.

For example, in U.S. Pat. No. 6,013,920 Gordon et al. describes a FOUP load port interface 120 that facilitates collection of data about the number and location of semiconductor wafers within a FOUP 122, as shown in FIGS. 1*a* and 1*b*. The load port interface 120 is adapted to receive, open and close a FOUP 122. The load port interface 120 includes a bulkhead 124 that mates with and seals the semiconductor processing equipment (not shown). A vertical support brace 126 projects outward horizontally from one side of the load port interface 120 toward or away from the bulkhead 124 and supports a movable table 132. The FOUP 122 is placed on table 132 by an operator, an automatic guided vehicle (AGV) or an overhead rail system. A FOUP drive mechanism 128 rotates the FOUP horizontally so the FOUP 122 abuts with and seals against the bulkhead 124. On the other side of the bulkhead 124 from the FOUP 122, the load port interface 120 comprises a FOUP door-engaging end-effector 142 that also seals against the bulkhead 124.

Wafer sensors 186 are mounted on the end-effector 142 near its top, as shown in FIG. 1*b*. The wafer sensors 186 include a left-hand and a right-hand optical detector, each comprising a diode light sensor and a laser diode that emits a beam of light. A motorized door-removal drive-mechanism 162 included in the load port interface 120 supports the end-effector 142 at an upper end of a pedestal 164 (FIG. 1*a*). As the end-effector 142 retracts and moves the FOUP door 148 downward within cover 178, the wafer sensor 186 sequentially passes each of the wafers 4 within FOUP 122. By sensing the position of a wafer 4 as the end-effector 142 passes each of the plurality of wafers, the load port interface 120 obtains data that records both the number of wafers carried and the vertical location of the wafers within the FOUP 122.

Another wafer detection system is described in U.S. Pat. No. 6,452,503 to Weiss. That patent describes a wafer imaging system 220, as shown in FIG. 2, comprising a camera 214 or other image sensor that is positioned at a known position $Z_{ref}$, θ in relation to an open front of a cassette 210. The image sensor views at once an entire stack of wafers 212 in the cassette. Preferably, a light source 216 is disposed around the camera to illuminate the wafers. An image of the entire stack of wafers is captured and is image-processed to provide information on the separation of the wafers within the cassette; any cross-slotting of wafers, and the center point of each of the wafers.

A common requirement of wafer sensing systems such as those described above is that the FOUP must be opened before wafer sensing is performed. A disadvantage of such systems is that in cases where wafers are not properly loaded into the cassette, the cassette needs to be closed again and removed from the processing tool for correction of the improper wafer loading. This additional opening and closing creates unnecessary disturbances and exposes the wafers to possible contamination which preferably should be avoided. Another disadvantage is that at the input/output station, where cassettes are loaded into a processing tool, a FOUP opener mechanism needs to be present. Although many processing tools have a FOUP opener at the input/output station, this is not always the case. A system comprising a stocker, such as the A412™ furnace system of ASM, does not have a door opener available at the input/output station. In such furnace systems, after placing a FOUP cassette on the FOUP input/output station by an operator, an AGV or an overhead rail transport system, the FOUP is transferred from the input/output station to a stocker inside the system by a cassette-handling robot. When the wafers in the cassette are to be processed, the cassette is transported to a FOUP opening station, where the FOUP is opened for wafer handling. However, if wafer mapping occurs as late as just prior to the start of the wafer handling, valuable time is lost in cases where a problem with the wafers is detected. In order to avoid this time loss, wafer mapping desirably should occur when the FOUP is loaded onto the input/output station or directly after that loading.

Accordingly, there is a need for methods and systems of mapping wafers which address the problems discussed above.

SUMMARY OF THE INVENTION

According to one aspect of the invention, a method is provided for processing semiconductor wafers. The semiconductor wafers are supplied in a FOUP to a semiconductor processing tool. The position of the wafers in the slots of the FOUP are determined while the FOUP is closed. Subsequently, after determining that the wafers are correctly positioned in the FOUP, the FOUP is opened to transfer the wafers out of the FOULP for processing. For example, the wafers are deemed to be correctly positioned if the FOUP is provided without missing wafers or cross-slotted wafers.

According to another aspect of the invention, a method for evaluating a loading of a stack of wafers in wafer slots of a cassette is provided. The method comprises taking a plurality of images of the edge portions of the wafers using a digital camera. The images are taken through an at least partially transparent part of a closed cassette. The camera is moved relative to the cassette in the stack direction to take the plurality of images, such that at least one image of each wafer slot is taken and each image covers less than all of the wafer slots. The images are processed to detect the presence of a wafer edge and to provide output data to represent the loading status of each wafer slot.

According to yet another aspect of the invention, a system is provided for detecting a load condition of a plurality of wafer slots in a wafer transport module. The system comprises at least one radiation source. At least part of the wafer transport module is at least partially transparent to the radiation emitted from the at least one radiation source. The radiation source is positioned and aligned to direct the radiation emitted from it through the at least partially transparent part of the wafer transport module to an edge portion of a wafer upon retention of the wafer in one of the wafer slots. At least one image sensor is provided and aligned to detect radiation reflected from the edge portion of the wafer upon retention of the wafer in the slot. The at least one image sensor has a field of view covering at least one wafer slot and is configured to provide output signals representative of the edge portion of the wafer. The system also comprises a positioning/aligning mechanism to position/align the at least one image sensor relative to the wafer transport module, wherein the wafers are accommodated horizontally oriented and stacked in a vertically spaced apart relationship, and in a horizontal position so that an uppermost field of view covers a top wafer slot and a lowermost field of view covers a lowest wafer slot in the wafer transport module. A controller is in communication with the at least one image sensor and the positioning/aligning mechanism. The controller is configured to position and/or align the at least one image sensor to capture a plurality of images of a wafer, upon retention of the wafer in one of the wafer slots, from different angles relative to the wafer slot, so that each wafer slot is covered by at least two images. One of the at least two images provides a view of the wafer from a different angle relative to the wafer slot than a remainder of the at least two images. An image processor in communication with the at least one image sensor is adapted to process images from the at least one image sensor and to provide output data representing a loading status of each wafer slot. The image processor is also adapted to ignore information from parts of the images deteriorated by obstructions in the at least partially transparent part of the wafer transport module.

According to another aspect of the invention, a system is provided for detecting a wafer in a wafer cassette. The system comprises at least one radiation sensor. The at least one radiation sensor is configured to face a wall of the wafer cassette and to detect radiation reflected through the wall from a wafer, upon retention of the wafer in the wafer transport module. In addition, the at least one radiation sensor is configured to align such that it views the wafer at different angles with respect to the wafer transport module.

BRIEF DESCRIPTION OF THE DRAWINGS

The invention will be better understood from the detailed description of the preferred embodiments and from the appended drawings, which are meant to illustrate and not to limit the invention, and wherein:

FIG. 1b is a top view of the prior art load port interface of FIG. 1a;

FIG. 5B shows a plurality of search areas which intersect expected wafer positions, within the field of view of the camera of FIG. 5A;

FIG. 7 shows an identification field within the field of view of FIG. 5A; and

DETAILED DESCRIPTION OF THE PREFERRED EMBODIMENT

Figure 1A:
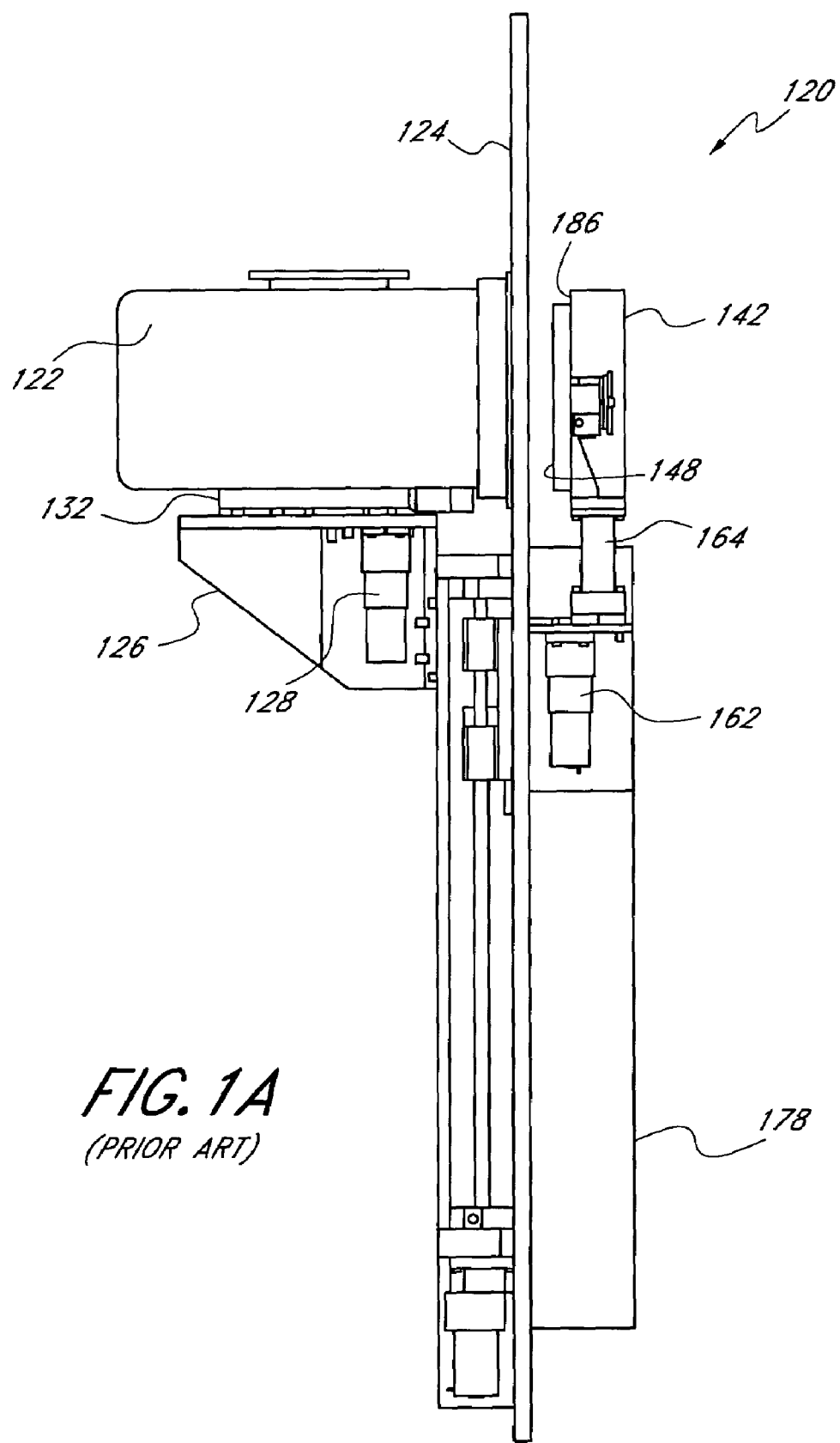
FIG. 1a is a side view of a prior art load port interface provided with wafer sensors.
Figure 1B:
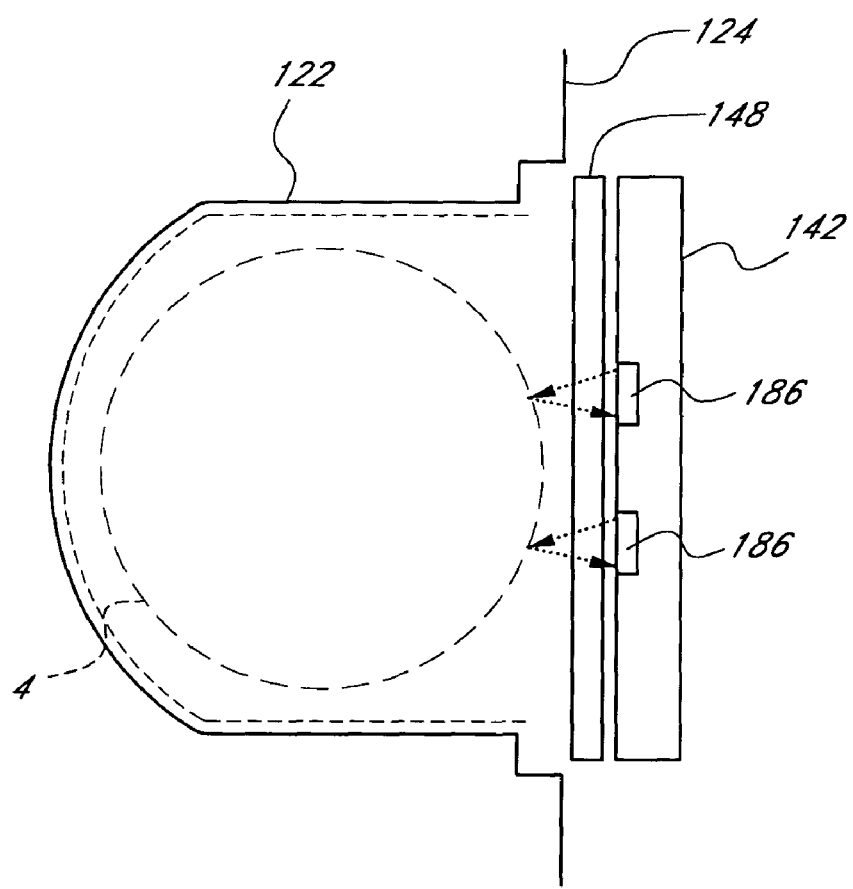
Figure 2:
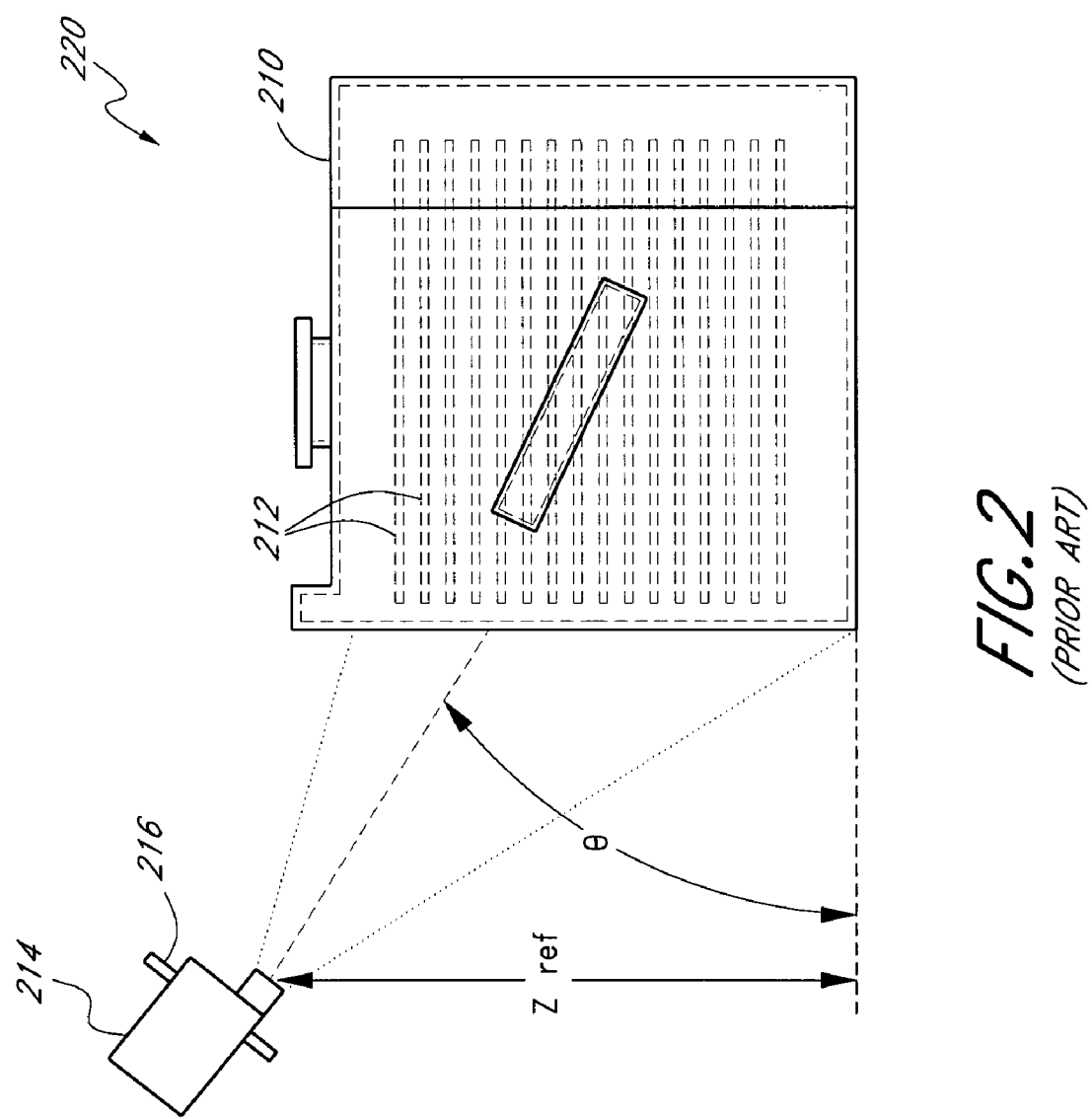
FIG. 2 is a cross-sectional view of an exemplary wafer imaging system configured to image wafers in an opened FOUP.

An imaging system with an image sensor is provided for gathering information on wafers in a cassette. Typically, the cassette is a closed structure such as a FOUP and at least a part of the cassette is at least partially transparent to radiation emitted from a radiation source. The source of radiation is preferably disposed outside the cassette and the radiation is preferably directed through the transparent part of the cassette, to an edge portion of the wafers inside the cassette. The sensor is aligned to detect radiation reflected or coming from the wafers through the transparent part of the cassette. Data from the sensor is processed to determine the loading status and orientation of the wafers in the cassette.

The radiation emitted from the source of radiation can be any type of electromagnetic radiation including, but not limited to, UV, visible or infrared light, X-rays or radio waves. Other types of radiation, such as acoustic radiation, preferably ultrasonic sound, can also be used. The image sensor is sensitive to wavelengths of radiation coming off the wafers, which will often (but not always) be the same wavelengths of radiation emitted by the radiation source. To improve the signal-to-noise ratio of the processed data, the sensor can also be provided sensitive to the specific wavelengths of radiation reflected from the wafers. Where a broad spectrum of wavelengths is emitted, the sensor can be provided sensitive to only particular wavelengths of the emitted spectrum.

As noted above, at least a part of the cassette is at least partially transparent to the radiation used to detect the wafers. For example, the housing of the cassette can be visibly semi-transparent or translucent. The translucent housing might be colored, e.g., orange or blue. For a translucent cassette, light can be used as the radiation. Although part of the light can be reflected or absorbed by the housing of the cassette, a significant part of the light will be transmitted and will reach the wafers. Upon reaching the wafers, the light will be reflected back, primarily at the wafer edges.

Visible wavelengths of light can be used as the radiation but, preferably, infrared light is used when a cassette is visibly semi-transparent or translucent. The transparency of the cassette for infrared light is generally larger than that for visible light and is independent of the color of the cassette. In other embodiments where the cassette is opaque or non-transparent to light, including even infrared radiation, electromagnetic radiation of another wavelength or acoustic radiation may be used. Advantageously, in contrast to typical systems, the cassette that houses the wafers need not be open for gathering information on wafers.

The source of radiation can direct a beam of radiation to the edge of the wafer and the reflection of the beam can be measured by a sensor. Preferably the sensor is an imaging sensor, such as a video camera, an X-ray camera or an acoustic camera configured to create an image of, or at least part of, the wafers stored inside a cassette. In addition, the imaging sensor is preferably a digital sensor, e.g., a digital camera, that outputs a digital image.

In one preferred embodiment, at least two images are taken of each wafer slot, but from different angles, e.g., from different vertical and/or horizontal positions. Multiple images of a wafer slot can be advantageous because the part of the cassette that is at least partly transparent might be inflicted with local obstructions or local highly reflective areas such as ribs in the cassette housing, labels, scratches or other features. Therefore, redundant information is preferably generated. At least two images, at different angles relative to a horizontal plane (e.g., the horizontal plane occupied by the wafer slot), are taken of each wafer slot so that if an obstruction renders one of the images, or an area of one of the images, useless, that image or that area of the image can be ignored and the other images can be used to analyze the wafer loading.

Reference will now be made to the drawings wherein like numerals refer to like parts throughout. It will be appreciated that the embodiments described below are meant to illustrate and not to limit the invention. For example, while the preferred embodiments are described in conjunction with a FOUP, other cassettes having at least partially transparent parts can also be used.

Figure 3A:
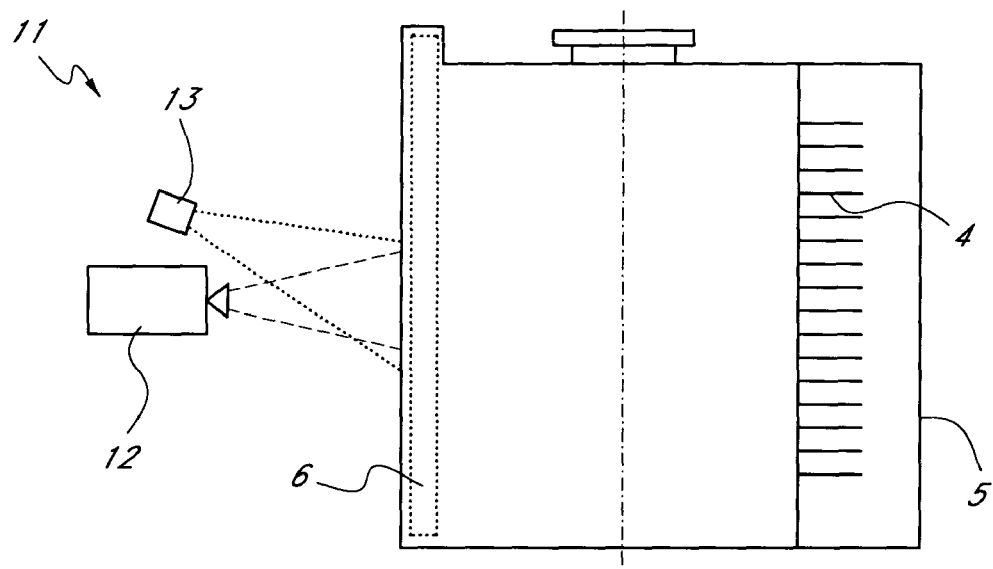
FIG. 3A is a side view of a wafer imaging system in front of a closed FOUP according to a preferred embodiment of the invention.
Figure 3B:
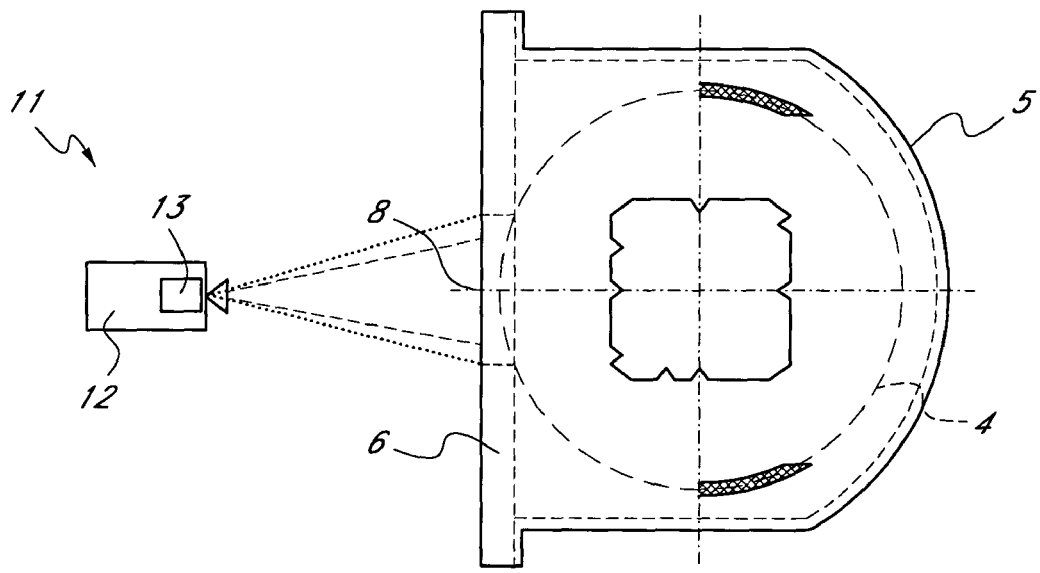
FIG. 3B is a top view of the wafer imaging system of FIG. 3A.
Figure 3C:
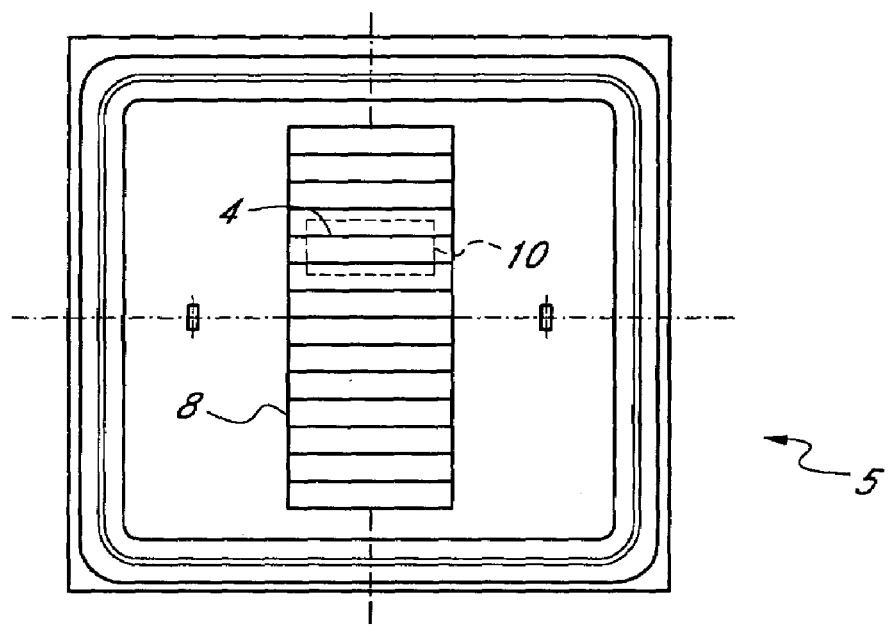
FIG. 3C is a front view of the FOUP of FIG. 3A, showing a transparent window in the center region of the FOUP door.

FIGS. 3A, 3B and 3C show an exemplary wafer imaging system 11 positioned proximate a closed, partly transparent, FOUP 5. The imaging system 11 comprises an imaging sensor 12, illustrated as a camera, a radiation source 13 and an image processor (not shown). The camera 12 and the radiation source 13 are located outside of the FOUP 5 and preferably in front of a transparent window 8, which is integrated in FOUP door 6, as shown in FIG. 3B and FIG. 3C. The transparent window 8 at least partly transmits the radiation, produced by radiation source 13, which is directed towards the edges of wafers 4. The camera 12 and the radiation source 13 are shown located at a fixed position with respect to each other and are together vertically translatable relative to FOUP 5. Although in FIGS. 3A and 3B the viewing axis of camera 12 is shown to be perpendicular to the plane of the FOUP door 6, a different alignment can be chosen, such that the viewing axis of the camera is at an angle, but not perpendicular to door 6. Also, the alignment of the radiation source can be changed relative to the alignment shown in FIGS. 3A and 3B. In a further embodiment, the radiation source 13 can be movable relative to camera 12 and at a fixed position relative to the FOUP 5.

The dotted rectangle indicated in FIG. 3C is the field of view 10 of the camera 12. The radiation source 13, for example, an IR source, illuminates the edges of wafers 4 located in the field of view 10 at a light level sufficient to allow the camera 12 to capture a "processable" image. The camera 12 can capture a number of images at different vertical positions relative to FOUP 5. The images are preferably mutually overlapping and each image covers two or more wafers 4. The image processor (not shown) is configured to receive images supplied by the camera 12 and to produce a wafer map of FOUP 5 based upon these images. Detecting the wafer presence through a window in the FOUP door is convenient because typically the door is completely flat, without any ribs or other features, and high quality images can be obtained. However, such a window may not be provided in a standard FOUP door. If a semiconductor wafer fabrication system uses FOUPs without a window in the door, another transparent part of the FOUP can be selected for the wafer detection, as is shown in FIG. 4.

Figure 4A:
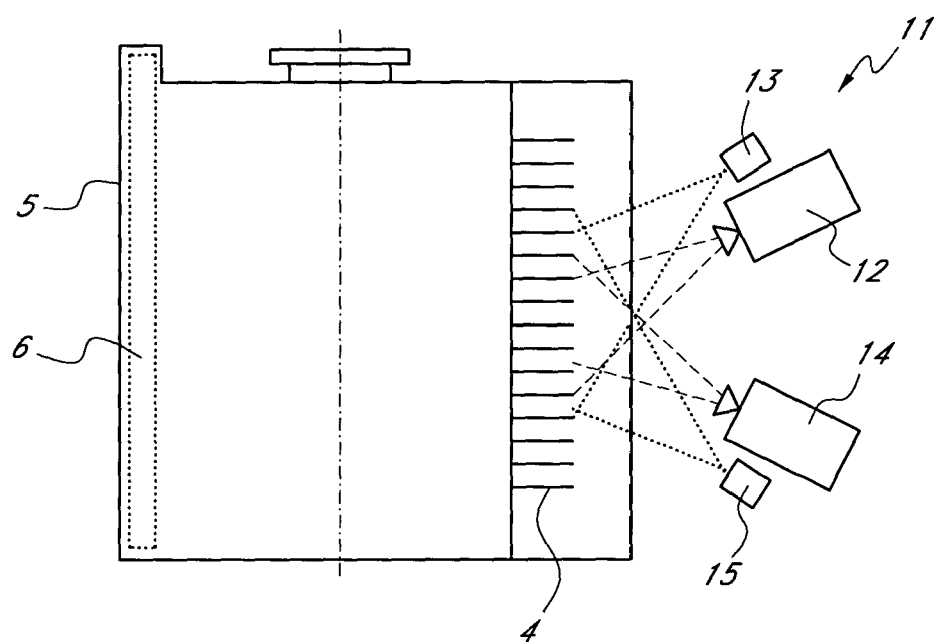
FIG. 4A is a side view of a wafer imaging system located at the backside of a closed FOUP according to a preferred embodiment of the invention.
Figure 4B:
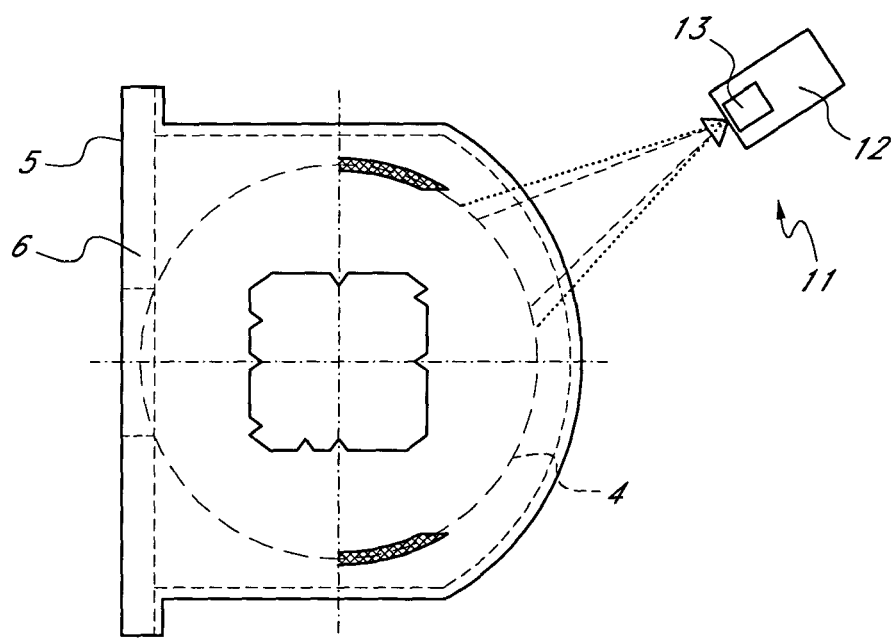
FIG. 4B is a top view of the wafer imaging system of FIG. 4A.

FIG. 4A shows a side view and FIG. 4B shows a top view of a wafer imaging system 11, in accordance with another embodiment, positioned at the backside proximate to a closed, partly transparent FOUP 5. The imaging system 11, located outside FOUP 5, is vertically translatable relative to FOUP 5. In addition to the camera 12 illustrated in FIGS. 3A–3C, the imaging system 11 can comprise an addition camera 14. Both cameras 12 and 14 are in a fixed position with respect to each other and are each provided with a radiation source, radiation sources 13 and 15, respectively. The radiation sources 13 and 15 are configured to illuminate the edge parts of wafers 4 located in the field of view of the cameras 12 and 14, respectively. The translucent housing of FOUP 5 transmits, at least partly, the radiation produced by the radiation sources 13 and 15. The cameras 12 and 14 are vertically spaced above each other and positioned and aligned to take images of an edge portion of a wafer at different viewing angles with respect to a horizontal plane. For example, the cameras 12 and 14 can be positioned and aligned such that the viewing angles, relative to a horizontal plane, at which images are taken of an edge portion of a certain wafer by the respective cameras have substantially the same absolute numerical value, but different signs, e.g., angles of +20±about 5° and −20° ±about 5°. It will be appreciated that the viewing angles can be determined by determining the angle that an imaginary line extending from the image sensor to the wafer slot makes with a plane which would be coplanar with the major surface of a wafer loaded into the FOUP 5, e.g., the plane could be the horizontal plane on which one of the wafer slots lies.

FIG. 4B shows a top view of the system 11. The angle and the horizontal position of the cameras 12 and 14 are such that blocking of the field of view (not shown) of at least one of the cameras 12 or 14 by obstructions located on the housing of FOUP 5 is prevented. Such obstructions can include, for example, ribs in the housing of FOUP 5, or text, labels or scratches disposed on the housing. The cameras 12 and 14 are vertically translatable relative to FOUP 5. The radiation sources 13 and 15 are configured to illuminate the edges of wafers 4 at a light level sufficient to allow the cameras 12 and 14 to capture an image of an edge part of the wafers with the field of view of each of these cameras. Each of the images taken by each of the cameras 12 and 14 preferably covers two or more wafers 4 and preferably are mutually overlapping. Furthermore, the images taken by first camera 12 preferably overlap the images taken by the second camera 14.

An advantage of an imaging system with a field of view that captures only part of the entire wafer stack is that the imaging system can be kept simple and compact, and can be disposed at a short distance from the FOUP. In principle, the field of view can be as small as to capture only one wafer.

However, in order to circumvent problems from local obstructions or highly reflective parts in the transparent part of the FOUP, preferably at least two images of each wafer are captured, each image giving a slightly different view of the wafer. This can be achieved by providing two cameras, the cameras aligned at different angles with respect to the wafers. Alternatively, the field of view can be enlarged to cover more wafers within the field of view. By taking pictures with an enlarged field of view at every slot height, multiple pictures of one wafer slot at different angles are obtained with only one camera. Also, a combination of the two measures can be utilized. In a preferred embodiment of the invention, two cameras are provided to take images from different angles and the field of view for each image is dimensioned to capture more than one wafer. For example, the field of view for each image can be the same, e.g., 3, wafers. For a FOUP with 25 wafer slots 27 pictures are taken with each camera. The pictures are taken with the camera at different vertical positions relative to the FOUP, such that each wafer slot is covered by three images per camera and in total by 6 images. An alternative for a second camera can also be formed by one or more mirrors that split the field of view of a camera in two parts, each part viewing the wafers at a different angle relative to a horizontal plane of reference.

The redundancy in information provided by multiple images advantageously addresses the problem of the partially transparent part of the FOUP housing having areas that obscure the wafers inside the FOUP. These areas can take the form of obstructions or highly reflective regions, such as ribs, FOUP identification marks, scratches or other such features, and can render some or part of the images useless. Another image of the same wafer, taken under a different angle, advantageously can circumvent these obstructing or obscuring areas to provide accurate measurement or mapping of the wafer. In addition, in cases where more than one image of a wafer is useable, the accuracy and/or reliability of detecting breaks or chips in the wafer can be increased by having available different views of the wafer for comparison.

In imaging the wafers, one or more cameras are preferably moved vertically relative to a FOUP and preferably a plurality of images is taken with the camera(s) at different vertical positions relative to the FOUP. This movement can be performed in numerous ways, some of which are described below.

For example, in one embodiment, the FOUP can remain stationary and the camera(s) can move. More particularly, the FOUP can be positioned at an input/output station of a semiconductor processing station that is provided with a safety shield. The safety shield is vertically movable and is retracted when the FOUP is to be transferred to the interior of the processing tool. The camera(s) can be mounted on the movable safety shield. Alternatively, a separate camera translation system can be provided to move the camera while the FOUP remains stationary on a platform. In another arrangement, the camera(s) can be mounted on a cassette handling robot that is available in the system for further transport of the FOUP. While the FOUP remains stationary, e.g., on an input/output platform, the robot comprising the camera can be moved along the FOUP to take a plurality of images of the wafers.

In another arrangement, the camera(s) can be mounted stationary and the FOUP moved vertically. Preferably, the FOUP is moved vertically by a cassette-handling robot. A cassette elevator can also be provided for dedicated vertical movement of the FOUP while the images are taken. In other arrangements, both the FOUP and the camera can be moved by, e.g., a combination of the movement mechanisms described above. In other embodiments, it will also be appreciated that neither the cameras nor the FOUP is required to be vertically translatable. For example, two cameras can be located spaced apart from each other and positioning the cameras for a particular field of view simply encompasses pivoting the cameras to point at a different wafer slot, although the sensor focusing mechanism and the image processing may be more complicated in this arrangement. In addition, the camera(s) can be moved independently of the source(s) of the radiation, e.g., the source(s) of radiation can be kept fixed while the camera(s) are moved relative to the FOUP.

As discussed above, the camera is sensitive to the radiation emitted by the radiation source. In one embodiment, the camera is sensitive to light and the source of radiation is a source of light. The source of light can be any known source of light including, but not limited to, a light bulb, a halogen lamp, a light emitting diode (LED) or an array of LED's or a fluorescent tube. In another embodiment, the camera is sensitive to infrared light and the light source is an infrared light source, preferably an array of infrared emitting LED's. For optimum illumination of a large part of the wafer edge, the LED's are arranged in a rectangular pattern, with the long side of the rectangle in the horizontal direction, and with the LED's aligned to emit light towards the wafer edge. The rectangular pattern can be, e.g., a single line arrangement of a plurality of LED's or a few parallel lines.

Imaging sensors used to detect wafers can have sensitivity over a significant spectral range beyond the specific wavelengths of the radiation directed to the wafers. A radiation filter can be used to filter out the extraneous radiation, i.e., radiation at wavelengths other than that used for detecting the wafers, to reduce the ambient noise caused by such extraneous radiation. The radiation filter can take the form of a physical radiation filter, e.g., an optical filter mounted to the image sensor, or filtering can be accomplished electronically, e.g., by digital processing. For example, a camera that is sensitive to infrared light can also be sensitive to visible light. When using infrared light as the radiation, a light filter that only transmits infrared light can be used, the light filter preferably being mounted directly in front of the camera. In this way, visible light from the clean room environment is filtered out and the signal-to-noise ratio of the resultant image is improved. The sensor and/or the filter are arranged to allow detection of the type of radiation coming off the wafers, which in some instances is different from that emitted by the radiation source.

Figure 5A:
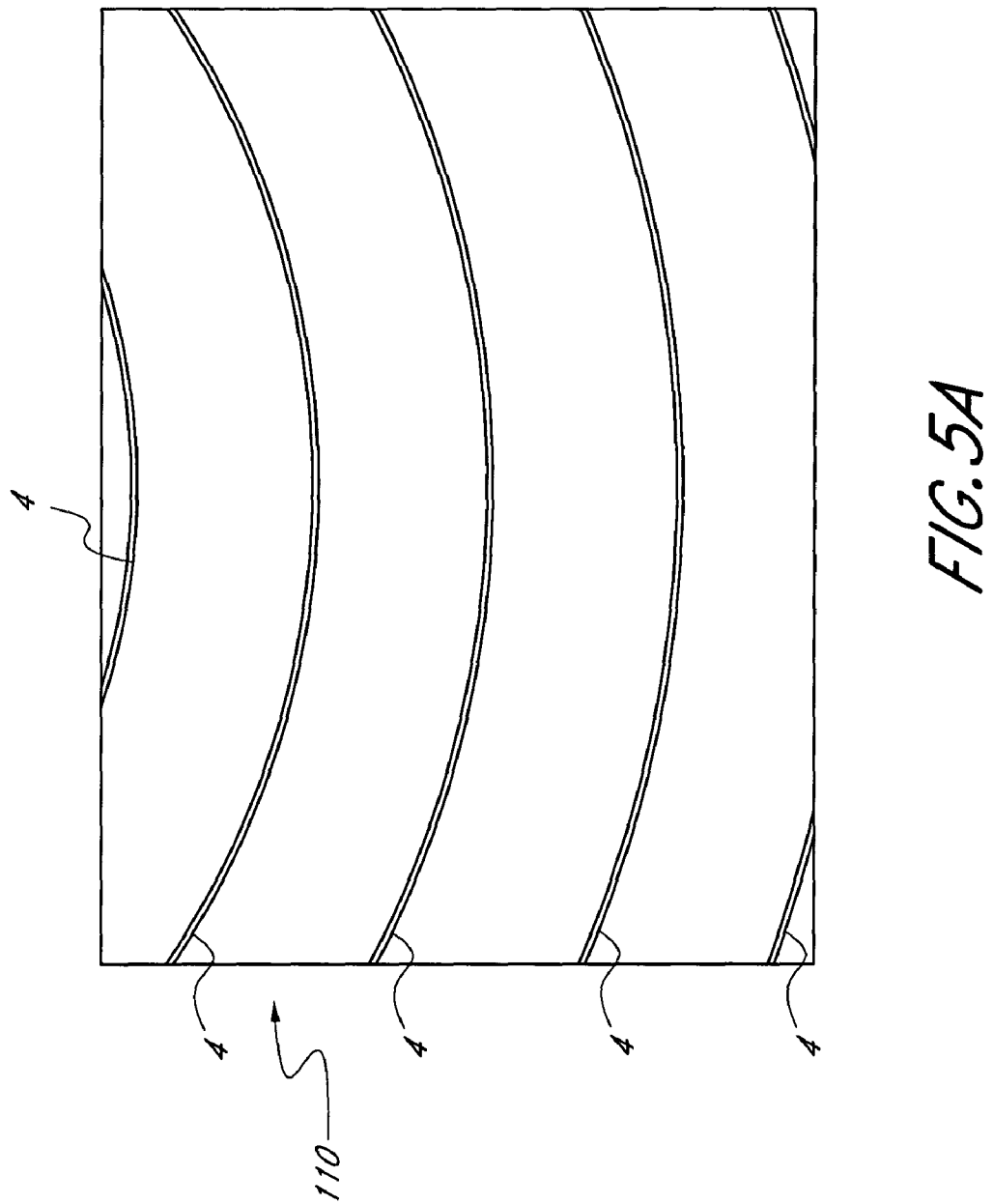
FIG. 5A is the field of view of a camera according to a preferred embodiment of the invention.

FIG. 5A shows a field of view 110 that adequately covers three (3) wafers 4 for measurement. Parts of two more wafers are also covered but these parts are too small for reliable determination of wafer presence and preferably are not be used for wafer measurement. Along the expected wafer position a number of search areas 52 within the field of view 110 are disposed such that the wafer will intersect search areas 52, as shown in FIG. 5B.

Figure 6A:
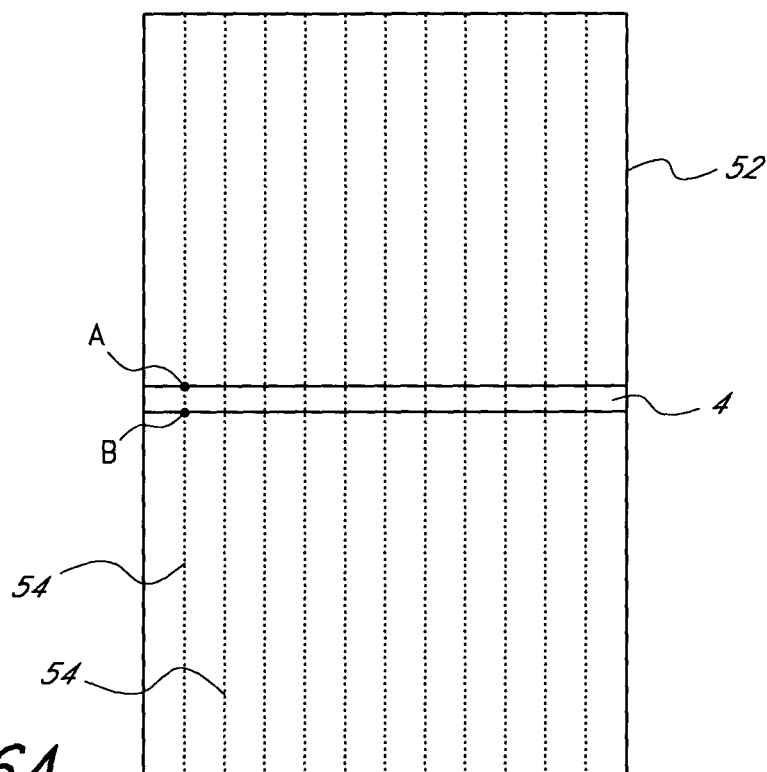
FIG. 6A shows lines within a search area along which the light intensity is measured.
Figure 6B:
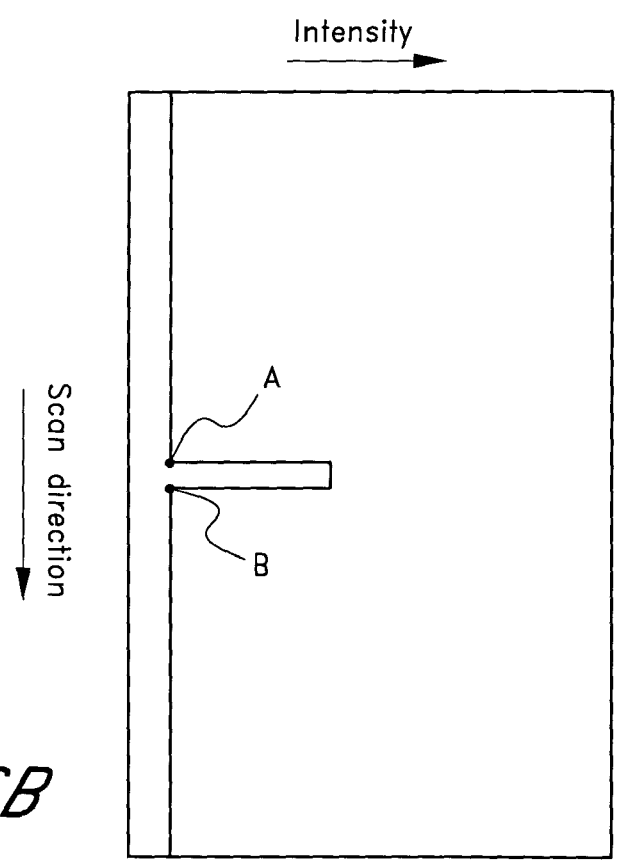
FIG. 6B represents the light intensity along a line in FIG. 6A.

Each search area 52 is preferably analyzed through a pattern of mutually spaced vertical lines 54, as shown in FIG. 6A. The measured radiation intensity as a function of vertical position along a line 54 is shown in FIG. 6B. Reflection from the wafer edge will result in an increased radiation intensity, light intensity in the illustrated example, as detected by the camera 12 or 14 (FIGS. 4A and 4B). Coordinates "A" and "B" correspond to vertical scan positions where a drastic change in the intensity profile is observed. Typically, the image processor is configured to detect a drastic increase in intensity and a first scan is made in a downward direction to detect coordinate A and a second scan is made in an upward direction to detect coordinate B. Two parameters, the deviation of the wafer plane from the horizontal plane and the thickness of the wafer, are preferably checked in order to determine whether the drastic change in intensity is caused by a single wafer correctly positioned in a slot or whether the wafer is incorrectly positioned in a slot, for example, in a cross-slotted position where the wafer is misaligned and occupies two different slots in the FOUP 5 (FIGS. 3A–3C).

To determine the angle of a wafer 4 with respect to the horizontal plane, the points "A" within a particular search area 110 (FIGS. 5A and 5B) are connected by a straight line using a least-squares fit method. Subsequently, the angle of the points "A" relative to a horizontal line is calculated for the best-fit line. In a similar manner, the angle for the line connecting the points "B" is determined. The straight lines calculated in this manner typically will correspond to the edge of a wafer 4. Consequently, a particular wafer 4 in the field of view 110 is considered correctly loaded where the calculated angles are within a predefined range, such that the wafer 4 is situated roughly horizontally.

The thickness of wafer 4 is determined by measuring the distance between point "A" and point "B". This thickness can be calculated at a certain position within the search area, e.g., the center. Alternatively, an average thickness of a wafer 4 can be calculated based upon the distances calculated for a number of lines 54 or of all lines 54.

If the slope and the thickness calculated are within predefined limits, a search is marked "positive." In cases where only one or none of the specifications are met, the search area is marked "negative." It will be appreciated that the determination of wafer position can be done in various other ways, e.g., a comparison can be made between an area of high detected radiation intensity within the field of view 110 and a reference such as an expected area of high intensity. It will also be appreciated that the absence of a spike in reflected radiation intensity at an expected horizontal location is indicative of a missing wafer. Moreover, an analysis showing, e.g., a varying thickness or points consistent with more than one line, or a line at a deviating position can indicate a broken wafer.

As noted above, the wafer imaging system 11 can advantageously be configured to address the problem of obstructions, highly reflective regions or other wafer obscuring features within the partially translucent part of the FOUP 5 which can cause a deterioration in the ability of the system 11 to resolve the wafers inside the FOUP 5. These features can result in search areas 52 that do not allow the proper determination of a wafer presence. Such a search area 52 may be called a "defective" search area. The defective search areas can be determined by a sort of calibration procedure: a wafer mapping procedure is performed for a FOUP when it is empty, without any wafer loaded into the FOUP and a second wafer mapping procedure is performed for the same FOUP in a completely and properly loaded state. In this calibration procedure, the proper loading can be checked, e.g., visually or by any other known method, so that the FOUP can be used as a reference for proper loading. A search area 52 should be marked "negative," indicating no wafer present, for the empty FOUP and "positive," indicating a wafer present and properly positioned, for the loaded FOUP. If this is not the case, the search area is defective and will not be used for further analysis. This information is stored for future reference and is used as a wafer image filter. Thus, the defective search areas can be earmarked for a particular FOUP 5, so that these areas may be ignored in future measurements using that FOUP. In another arrangement, if multiple images of a wafer are captured and at least one of these images is useable, then the entire image with the defective area can be earmarked to be ignored in subsequent mapping procedures.

It will be appreciated that different types of FOUPs can have the obstructions or highly reflective regions at different positions, depending on the design of the FOUP. Therefore, the defective search areas or defective images need to be determined for each type of FOUP. In order to avoid errors and to increase the flexibility of the wafer mapping method and system described herein, FOUP-type recognition software is implemented in the image processor to read cassette or FOUP identification marks. For this purpose, the images provided by the cameras 12 and 14, which cover the entire height of the FOUP, are subjected to visual inspection for FOUP-type identifying features. The identifying feature could be an alpha-numerical string or any other distinguishable mark. In FIG. 7, an example is given of a unique feature observed in an identification field 42. The size of this identification field 42, its exact location in the field of view 110 and the image number corresponding with the field of view 110, together with information relating to the feature to be observed, can be stored in a memory for future reference. Advantageously, the identification marks may identify both the type of FOUP being mapped and also the identity of a particular FOUP, if the identification mark is unique for each FOUP.

The identification of FOUP and/or FOUP-type described above uses the same images that are used for the wafer detection and mapping. The images are taken at a relatively short distance from the FOUP. Alternatively, a different image is taken, from a larger distance, and the general shape of the FOUP is used for FOUP-type identification. In another embodiment, a color sensitive sensor can be used to detect the color of the FOUP. This color data, together with other information, such as that described above, can be used for FOUP-identification. Thus, by using the cassette identification mark, the type or the identity of a particular FOUP can be determined and defective search areas or images can be stored by FOUP identity or type, such that these areas or images can be ignored or filtered out in subsequent processing of the images of the FOUP type and/or the particular FOUP.

In another embodiment, a FOUP identification is not used to identify a FOUP. Rather, the results of the analysis of the search areas are compared with data relating to pre-measured filters. In a preferred embodiment six images per wafer are taken and each image comprises seventeen search areas per wafer, so that in total one hundred and two search areas per wafer are available. A particular FOUP will typically have a particular pattern of obstructed or defective search areas, which can be compared to the pattern of anomalous search areas (e.g., areas having a different radiation intensity from that expected) observed in these images of a wafer to determine the appropriate filter for that FOUP. Consequently, both the wafer detection and the filter recognition can be performed using the same images. Although it is not always necessary to perform the filter recognition, recognizing a filter allows the defective search areas to be ignored in the final wafer map determination, which improves the reliability of the result.

Figure 8:
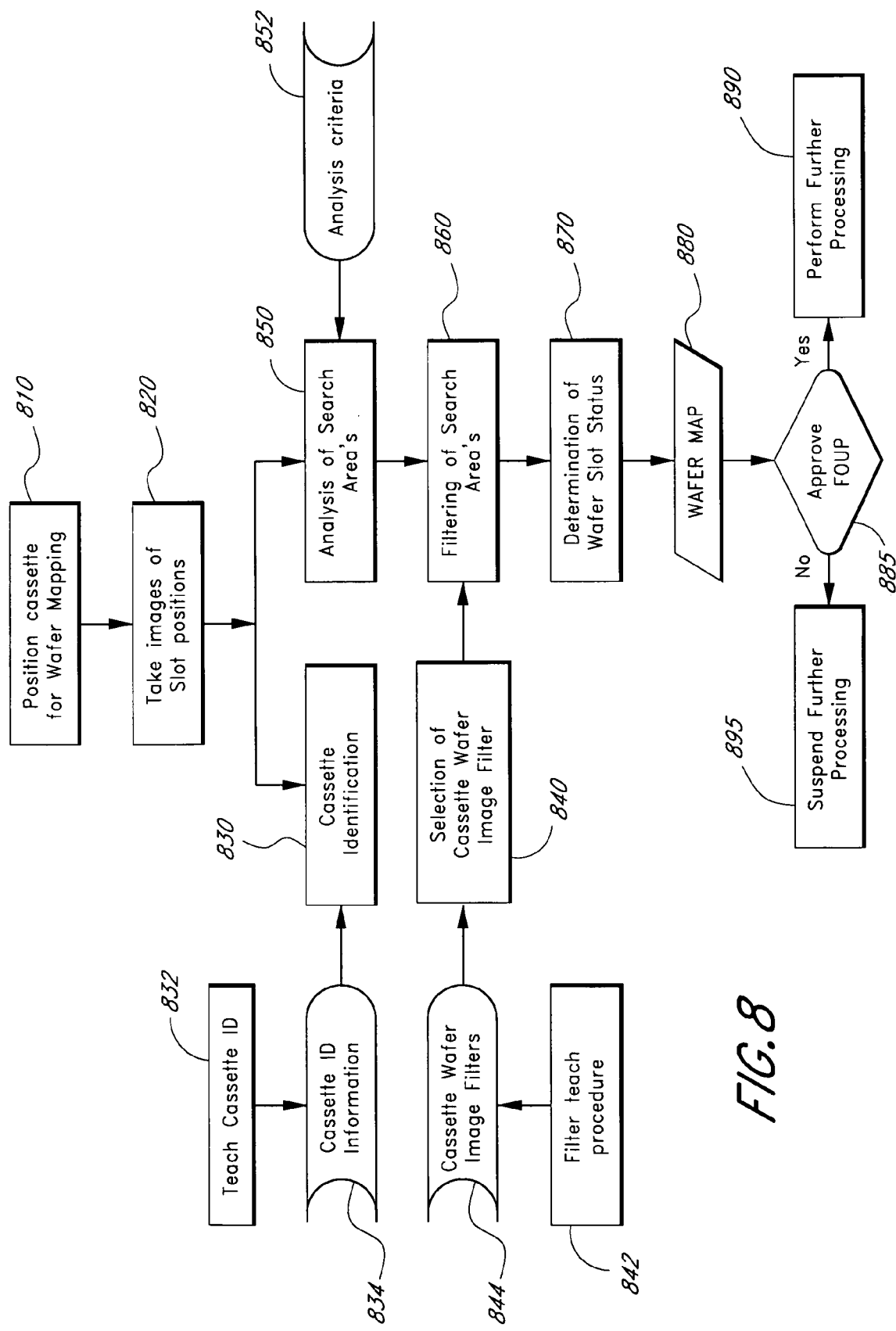
FIG. 8 is a flow chart illustrating steps in the generation of a wafer map according to a preferred embodiment of the invention.

The flow chart shown in FIG. 8 illustrates the steps to produce a wafer map, utilizing the wafer-imaging system 11. In step 810, a closed wafer cassette such as a FOUP is positioned on a specified wafer mapping location, for example, a cassette load port of a processing tool (not shown). In step 820, a wafer imaging system takes images of the slots of the closed wafer cassette such as by vertically translating one or more cameras relative to the closed, partly transparent wafer cassette and by taking images at a plurality of vertical positions of the camera(s) relative to the cassette in such a way that at least two images from different angles are taken of each slot position. Preferably, at least two images are taken of each slot position. The images acquired are used for cassette recognition and corresponding wafer image filter selection, as well as for wafer slot status determination.

In step 830, the cassette is identified. For example, a FOUP and its identification field 42 are scanned and all possible FOUP-types and identification fields 42 known to the system are searched for the presence of the corresponding identification features until a match is established. Information relating to possible identification fields and corresponding identification features can be programmed into the system and/or may have been collected previously in a Teach Cassette ID procedure 832 and this information stored in a Cassette Identification Information File 834.

When a particular cassette has been identified, a corresponding wafer image filter can be selected in step 840 from a collection of known wafer image filters 844, which, in turn, may have been generated by a Filter Teach Procedure 842. The wafer image filter can be, e.g., an electronic data file containing information regarding the locations of defective search areas. In step 850, all search areas 52 are analyzed for the presence of a wafer, based upon analysis criteria 852. These criteria can include, e.g., changes in reflected light intensity. In step 860 the selected wafer image filter is used to ignore the analysis results for all defective search areas 52 and to allow for further processing of the non-defective search areas.

In step 870 the slot status is determined for the wafer slots of the cassette, based on the analysis of the results for all search areas 52 not filtered out by the wafer image filter. A wafer is determined to be correctly placed in a slot in the FOUP 5 if a predefined percentage, for example, about 90% or more, of the search areas 52 for a certain wafer are "positive." Alternatively, if only a predefined percentage, for example, about 10% or less, of the search areas 52 for a certain wafer are "positive", the wafer is determined to be absent. Other percentages may be chosen, depending on circumstances, such as about 80%/20%, or about 95%/5%. In step 880 a wafer map is constructed based upon the status of each wafer slot, as determined in step 870. In step 885 the FOUP is approved for further processing or rejected. Approval can be dependent on a match of the determined wafer map with an expected wafer map. In other systems, an expected wafer map might not be known and approval is only dependent on the absence of any cross-slotted or broken wafers. When the FOUP is approved for further processing, the FOUP can be opened and the wafers can be transferred into a processing tool, as indicated in step 890. When the FOUP is rejected, further processing is suspended, as indicated in step 895.

Thus, advantageously, based upon the foregoing, the wafer loading status of a cassette can be checked without opening the cassette and possibly exposing the wafers to contamination. Moreover, because a mechanism for opening the cassette is no longer necessary, the loading of the cassette can be checked at any point before processing. Preferably, the loading status is checked early after loading a cassette into a processing system, e.g., at the input/output station of the processing system, so that time is not wasted moving the cassette through the processing system, only to have the cassette moved back through and out of the system to correct an improperly loaded slot or to remove a broken wafer. Additionally, by taking multiple images of a wafer slot from more than one angle, obstructions and other obscuring areas of the cassette in the line of sight of the image sensor at one angle can be avoided and the wafer slot can still be effectively resolved. Also, by earmarking defective search areas or images, the efficiency and accuracy of image processing can be increased, since obscured views or search areas are not processed.

In addition, it will be appreciated that while illustrated moving along a vertical plane to capture images of horizontally oriented and vertically spaced wafers and wafer slots, the image sensors can be configured to move horizontally and/or vertically. For example, rather than being vertically separated, the images sensors can be arranged on the same horizontal plane, but view the wafer slots from different angles on that plane. Moreover, in cases where a wafer transport module extends horizontally, e.g., where wafers are oriented vertically and spaced horizontally, the image sensors can be configured to move horizontally along the transport module to capture images of the wafers.

Accordingly, various other modifications, omissions and additions may be made to the methods and structures described above without departing from the scope of the invention. All such modifications and changes are intended to fall within the scope of the invention, as defined by the appended claims.

What is claimed is:

1. A method for evaluating a loading of a stack of wafers in wafer slots of a cassette, comprising:
   taking a plurality of images of edge portions of the wafers using a digital camera, wherein the images are taken through an at least partially transparent part of a closed cassette, wherein the camera is moved relative to the cassette to take the plurality of images, such that at least one image of each wafer slot is taken and wherein each image covers less than all of the wafer slots;
   processing the images to detect a presence of a wafer edge and to provide output data to represent a loading status of each wafer slot.

2. The method of claim 1, wherein taking a plurality of images comprises taking at least two images of each wafer slot, wherein each of the at least two images are taken from different angles relative to a plane on which one of the wafer slots lies, and wherein information is ignored from any area of the at least two images that is obscured by a section of the at least partially transparent part of the cassette.

3. The method of claim 2, wherein the section of the at least partially transparent part of the cassette has a reduced transparency or a reflection that obscures a wafer slot.

4. The method of claim 2, wherein a first image of the at least two images is taken with the camera at a first height relative to a wafer slot and a second image of the at least two images is taken with the camera at a second height relative to the wafer slot.

5. The method of claim 4, wherein the first image of the at least two images is taken by the digital camera and the second image of the at least two images is taken by a second digital camera.

6. The method of claim 2, further comprising:
   taking, at a camera position relative to the cassette, an image of one of the wafer slots when the slot is empty;
   taking, at the same camera position, a second image of the same wafer slot when the slot is correctly loaded;
   determining an obscured camera position by processing each image taken when the slot is empty and when the slot is correctly loaded, wherein a camera position is obscured if an image taken from the camera position detects a wafer when the slot is empty or detects no wafer when the slot is correctly loaded; and earmarking the camera position as obscured so as to ignore subsequent images taken of the same wafer slot from the same camera position.

7. The method of claim 2, wherein processing the images is limited to analyzing a plurality of search areas within a field of view of the camera, wherein the camera is positioned such that an expected wafer edge location intersects two or more search areas within the field of view.

8. The method of claim 7, wherein analyzing the plurality of search areas comprises measuring an intensity of a radiation within the search area.

9. The method of claim 8, wherein analyzing the plurality of search areas comprises fitting a line to points of high radiation intensity to determine a position of one edge portion.

10. The method of claim 7, comprising:
taking at a camera position relative to the cassette an image of one of the wafer slots when the slot is empty;
taking at the same camera position a second image of one of the wafer slots when the slot is correctly loaded;
determining an obscured search area by processing each image taken when the slot is empty and when the slot is correctly loaded, wherein the search area is obscured if a wafer is detected in that search area when the slot is empty or no wafer is detected when the slot is correctly loaded; and
earmarking the search area as obscured so as to ignore the obscured search areas in subsequent images taken of the same wafer slot from the same camera position.

11. The method of claim 10, wherein the camera is positioned to capture a cassette identification indicator and wherein processing the images comprises analyzing additional search areas containing the cassette identification indicator to determine an identity of the cassette or to determine a cassette type and further comprising:
storing the obscured search areas by cassette identification indicator;
retrieving the obscured search areas for the cassette after analyzing the additional search areas containing the cassette identification indicator; and
ignoring the obscured search areas for the cassette while processing the images.

12. The method of claim 1, wherein the wafers are vertically spaced apart and wherein the edge portions of the wafers are horizontally oriented and the camera is moved vertically relative to the cassette.

13. The method of claim 1, wherein the cassette is a Front Opening Unified Pod.

14. The method of claim 1, wherein the output data indicates whether a wafer of the stack of wafers is missing, cross-slotted or broken.

15. The method of claim 1, wherein the camera is sensitive to a radiation type chosen from the group consisting of infrared light, visible light, ultra-violet light, X-rays, radio waves and sound waves.

16. A system for detecting a load condition of a plurality of wafer slots in a wafer transport module for accommodating a plurality of wafers horizontally oriented and stacked in a vertically spaced apart relationship, the system comprising:
at least one radiation source, wherein at least part of the wafer transport module is at least partially transparent to radiation emitted from the at least one radiation source, wherein the source is positioned and aligned to direct the radiation emitted from the at least one radiation source through the at least partially transparent part of the wafer transport module to an edge portion of a wafer upon retention of the wafer in one of the wafer slots;
at least one image sensor, wherein the at least one image sensor is positioned and aligned to detect radiation reflected from the edge portion of the wafer upon retention of the wafer in the slot, wherein the at least one image sensor has a field of view covering at least one wafer slot and is configured to provide output signals representative of the edge portion;
a positioning/aligning mechanism to position and/or align the at least one image sensor relative to the wafer transport module so that an uppermost field of view covers a top wafer slot and a lowermost field of view covers a lowest wafer slot in the wafer transport module;
a controller in communication with the at least one image sensor and the positioning/aligning mechanism, wherein the controller is configured to position and/or align the at least one image sensor to capture a plurality of images of a wafer, upon retention of the wafer in one of the wafer slots, from different angles relative to the wafer slot, wherein each wafer slot is covered by at least two images, wherein one of the at least two images provides a view of the wafer from a different angle relative to the wafer slot than a remainder of the at least two images; and
an image processor in communication with the at least one image sensor, the image processor adapted to process images from the at least one image sensor and to provide output data representing a loading status of each wafer slot, wherein the image processor is also adapted to ignore information from parts of the images deteriorated by obstructions in the at least partially transparent part of the wafer transport module.

17. The system of claim 16, wherein the wafer transport module is adapted to accommodate the plurality of wafers vertically spaced apart wherein the edge portions of the wafers are horizontally oriented.

18. The system of claim 17, wherein the controller is configured to position the at least one image sensor at different vertical positions to capture the plurality of images.

19. The system of claim 16, wherein the at least one image sensor is a single image sensor and wherein the positioning/mechanism is configured to position and/or align the single image sensor at a plurality of different positions relative to the wafer transport module to obtain the at least two images, wherein a field of view of the single image sensor spans two or more wafer slots.

20. The system of claim 16, wherein the at least one image sensor comprises a first image sensor aligned to detect radiation reflected from an edge portion of the wafer, upon retention of the wafer in one of the wafer slots, in a direction making a first angle with a horizontal plane, and a second image sensor aligned to detect radiation reflected from the edge portion in a direction making a second angle with the horizontal plane.

21. The system of claim 19, wherein the fields of view of both the first and second image sensor span two or more wafer slots and wherein the controller is configured to position each image sensor to capture at least two overlapping images of each wafer slot from different positions of the image sensors relative to the wafer transport module.

22. The system of claim 19, wherein the first and the second image sensors are in a fixed position relative to each other.

23. The system of claim 16, wherein the positioning/aligning mechanism is adapted to move the sensor vertically while the wafer transport module remains stationary.

24. The system of claim 16, further comprising an input/output station to accommodate and to load the wafer transport module into a semiconductor processing tool, wherein the input/output station is separated from the semiconductor processing tool by a vertically movable shield, wherein the vertically movable shield is the positioning/aligning mechanism and wherein the at least one image sensor is mounted onto the shield.

25. The system of claim 16, wherein the positioning/aligning mechanism is a wafer transport module handling robot.

26. The system of claim 16, wherein the image processor is configured to limit the analysis of the images to a plurality of particular search areas within the images.

27. The system of claim 26, wherein the controller is configured to position and/or align the at least one image sensor so that an expected wafer edge within the field of view intersects two or more search areas.

28. The system of claim 27, wherein the image processor is configured to ignore information from search areas focused upon obstructions in the at least partially transparent part of the wafer transport module.

29. The system of claim 27, wherein the system further comprises a memory for storing the search areas earmarked as focused upon obstructions and wherein the image processor is configured to determine which search areas are focused upon obstructions by analyzing the search areas for the wafer transport module when the wafer transport module is empty and further analyzing the search areas for the wafer transport module when the wafer transport module is completely and correctly loaded with wafers, wherein a particular search area is earmarked as focused upon an obstruction if a wafer is detected when the slot is empty or no wafer is detected when the slot is correctly loaded.

30. The system of claim 29, wherein the image processor is configured to analyze search areas positioned to cover a wafer transport module identification indicator or a wafer transport module type identification indicator and wherein the system is configured to store for each wafer transport module type which search areas are earmarked.

31. The system of claim 25, wherein the image processor is configured to analyze search areas positioned to cover a wafer transport module identification indicator or a wafer transport module type identification indicator.

32. The system of claim 16, wherein the wafer transport module is a Front Opening Unified Pod.

33. The system of claim 16, wherein the loading status of each wafer slot indicates whether a wafer is missing, cross-slotted or broken.

34. The system of claim 16, wherein the radiation emitted from the at least one radiation source is chosen from the group consisting of infrared light, visible light, ultra-violet light, X-rays, radio waves and sound waves.

35. The system of claim 16, wherein the at least one radiation source is chosen from the group consisting of a light bulb, a halogen lamp, a light emitting diode and a fluorescent tube.

36. A system for detecting a wafer in a wafer cassette, comprising:
at least one radiation sensor,
wherein the at least one radiation sensor is configured to face a wall of the wafer cassette and to detect radiation reflected through the wall from a wafer, upon retention of the wafer in the wafer transport module, and wherein the at least one radiation sensor is configured to align with the wafer at different angles with respect to the wafer transport module.

37. The system of claim 36, wherein the wall is a front wall of the cassette.

38. The system of claim 36, wherein the wall is a rear wall of the cassette.

39. The system of claim 36, wherein the cassette is a FOUP.

40. The system of claim 36, further comprising an image processor in communication with the at least one radiation sensor, wherein the image processor is adapted to process input data from the at least one radiation sensor and to provide output data representing a loading status of each wafer slot, wherein the image processor is also adapted to ignore information from parts of the images containing obstructions in the wall.

41. The system of claim 36, wherein the at least one radiation sensor comprises two radiation sensors, wherein each radiation sensor is aligned at a different angle with respect to the wafer transport module.

42. The system of claim 36, wherein at least a part of the wall is at least partially visibly transparent or translucent.

* * * * *

UNITED STATES PATENT AND TRADEMARK OFFICE
CERTIFICATE OF CORRECTION

PATENT NO. : 7,015,492 B2  
APPLICATION NO. : 10/641806  
DATED : March 21, 2006  
INVENTOR(S) : Garssen et al.

Page 1 of 1

It is certified that error appears in the above-identified patent and that said Letters Patent is hereby corrected as shown below:

Column 2, Line 55, delete "FOULP" and insert --FOUP--, therefor.

Column 6, Line 39, delete "+20±about" and insert --+20° ±about--, therefor.

Signed and Sealed this

Twelfth Day of September, 2006

JON W. DUDAS  
*Director of the United States Patent and Trademark Office*